(12) United States Patent
Nasman

(10) Patent No.: US 6,657,394 B2
(45) Date of Patent: Dec. 2, 2003

(54) REFLECTION COEFFICIENT PHASE DETECTOR

(75) Inventor: Kevin P. Nasman, North Chili, NY (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 09/827,719

(22) Filed: Apr. 6, 2001

(65) Prior Publication Data

US 2002/0171411 A1 Nov. 21, 2002

(51) Int. Cl.[7] ................................................ H01J 7/24
(52) U.S. Cl. .................. 315/111.21; 333/109; 333/124; 333/17.3; 333/99 PL
(58) Field of Search ..................... 315/111.21; 333/109, 333/110, 124, 132, 17.3, 32, 99 PL

(56) References Cited

U.S. PATENT DOCUMENTS

| | | | |
|---|---|---|---|
| 4,621,242 A | * 11/1986 | Theall, Jr. et al. ......... | 333/17.3 |
| 5,523,955 A | 6/1996 | Heckman ................ | 315/111.31 |
| 5,629,653 A | * 5/1997 | Stimson ................... | 333/17.3 |
| 5,654,679 A | * 8/1997 | Mavretic et al. ............ | 333/17.3 |
| 5,770,922 A | 6/1998 | Gerrish et al. .......... | 315/111.21 |

\* cited by examiner

*Primary Examiner*—Don Wong
*Assistant Examiner*—Thuy Vinh Tran
(74) *Attorney, Agent, or Firm*—Harness, Dickey & Pierce, P.L.C.

(57) ABSTRACT

A phase detector which determines the phase based upon the output signals from a power coupler. The power coupler outputs a first signal and a second signal. The first and second signals are input to a magnitude detector which determines the magnitude of the relative phase between the first and second signals. The first and second signals are also input to a sign discriminator which determines the sign of the phase between the first and second signals.

28 Claims, 2 Drawing Sheets

REFLECTION COEFFICIENT PHASE DETECTOR

BACKGROUND

1. Technical Field

The present invention relates generally to phase detectors and, more particularly, to a phase detector for a power delivery system which determines the phase of a reflection coefficient using two time varying signals of equal fundamental frequency.

2. Discussion

In a typical radio frequency (RF) plasma generator arrangement, a high power RF source produces an RF signal at a predetermined frequency, such as 2 MegaHertz (MHz), 4 MHz, or 13.56 MHz. The RF signal is output on a transmission line to a plasma chamber. Because an impedance mismatch often exists between the RF power source and the plasma chamber, a matching network is inserted between the RF power source and the plasma chamber. The plasma chamber often introduces non-linearities, which result in losses in the transmission line and in the impedance network, so that less than a full output power of the RF power source is applied to the plasma chamber.

In order to quantify this mismatch, conventional systems introduce a probe at the input to the plasma chamber to detect the voltage and current of the radio frequency signal as it is applied to the plasma chamber. Accurately measuring the voltage and current in close proximity to the plasma chamber provides a better indication of the quality of the plasma. A better indication of the quality of the plasma in turn enables better control of the etching or deposition process taking place within the plasma chamber. Conventional probes are limited in that they monitor the voltage, current, and phase angle of the signal applied to the plasma chamber.

Another type of sensor placed in proximity to the plasma chamber provides only magnitude information of the power applied to the plasma chamber, the forward power, and power reflected back from the plasma chamber, the reflected power. While the forward and reverse power is extremely useful in controlling the RF power supply in order to deliver the optimal RF signal to the plasma chamber, conventional sensors which measure the forward and reverse power do not presently provide phase information. As is known to those skilled in the art, phase information enables a determination of the reflection coefficient. Conventional power sensors are directional pickups and do not enable the determination of the relative phase between the forward and reverse power.

Thus, it is desirable to provide a phase detector for use in conjunction with a directional pickup which provides both forward power, reverse power, and phase information.

SUMMARY OF THE INVENTION

The present invention is directed to an apparatus including a power delivery system coupler receiving an output from a power generator. The coupler detects a first parameter and a second parameter, the coupler generates a respective first signal and a second signal. Each signal varies in accordance with the respective first and second parameters. A phase detector receives the first signal and the second signal from the coupler. The phase detector determines a relative phase between the first signal and the second signal in accordance with the first parameter and the second parameter.

For a more complete understanding of the invention, its objects and advantages, reference should be made to the following specification and to the accompanying drawings.

BRIEF DESCRIPTION OF THE DRAWINGS

The drawings, which form an integral part of the specification, are to be read in conjunction therewith, and like reference numerals are employed to designate identical components in the various views.

DETAILED DESCRIPTION OF THE INVENTION

Figure 1:
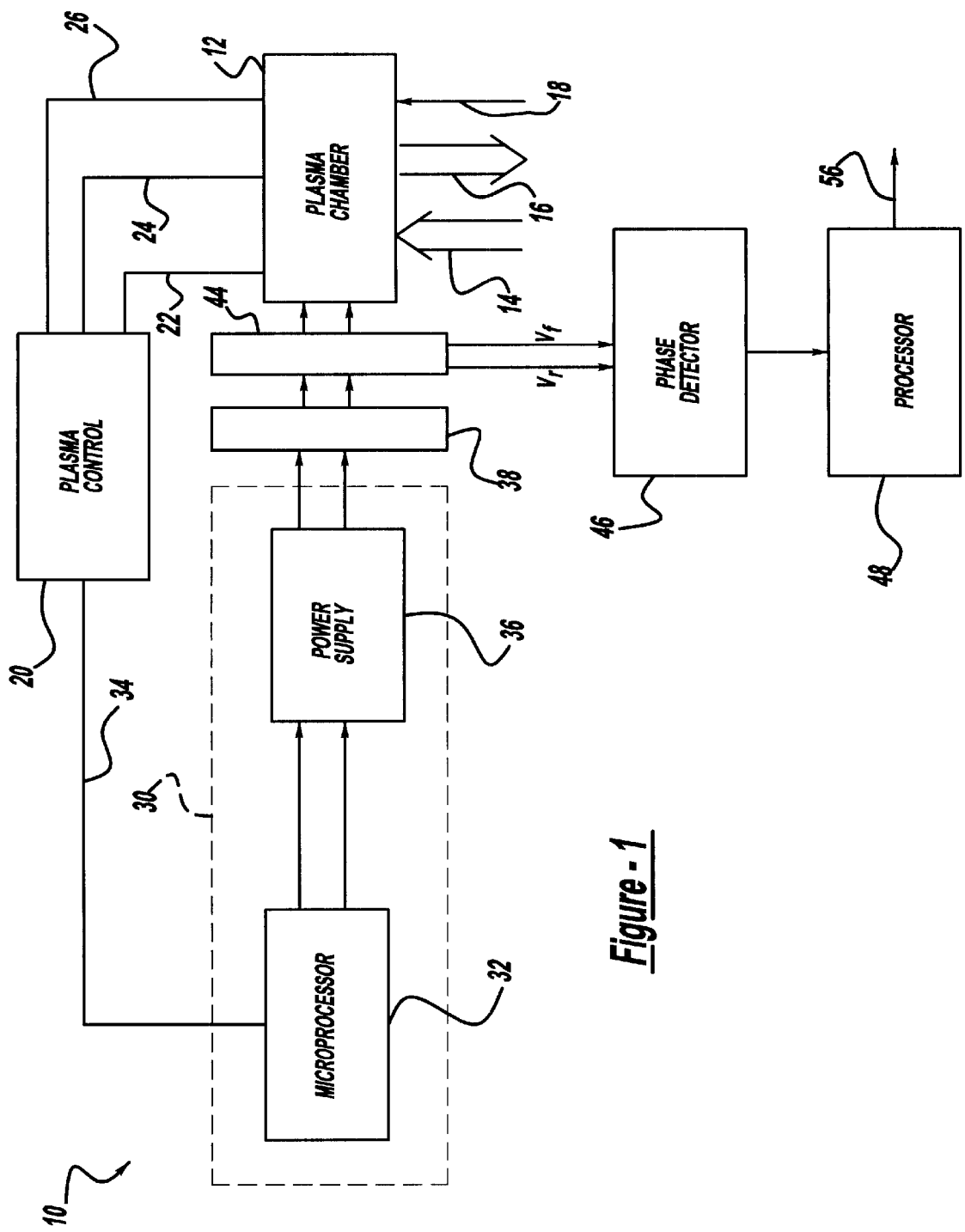
FIG. 1 is a block diagram of a power delivery system arranged in accordance with the principles of the present invention.

FIG. 1 depicts a plasma control system 10 arranged in accordance with the principles of the present invention. Plasma control system 10 includes a plasma chamber 12, such as may be used for fabricating integrated circuits. Plasma chamber 12 includes one or a plurality of gas inlets 14 and one of a plurality of gas outlets 16. Gas inlets 14 and gas outlets 16 enable the introduction and evacuation of gas from the interior of plasma chamber 12. The temperature within plasma chamber 12 may be controlled through a heat control signal 18 applied to plasma chamber 12.

A plasma controller 20 utilizes inputs from plasma chamber 12. These inputs include a vacuum signal 22, which indicates the level of vacuum in the chamber; a voltage signal 24, which indicates the voltage generated within plasma chamber 12; and a flow ratio signal 26, which indicates the ratio flows between the inlet and outlet gasses. As one skilled in the art will recognize, other inputs/outputs may be received/generated by plasma controller 20. Plasma controller 20 determines the desired input power to be applied to plasma chamber 12 through a power delivery system 30.

Power delivery system 30 includes a microprocessor or controller 32 which receives an input signal 34 from plasma controller 20. Microprocessor 32 generates control signals to power supply 36. The voltage output from power supply 36 is input to a matching network 38. Matching network 38 matches impedances between power delivery system 30 and plasma chamber 12 so that power supply 36 drives a predetermined impedance, which is preferably 50 ohms, but may vary.

A directional or power coupler 44, also known as a directional or power probe, is interposed between matching network 38 and plasma chamber 12. Power coupler or probe 44 outputs a pair of time varying signals which are proportional to the forward power $V_f$ and the reverse or reflected power $V_r$. The forward power $V_f$ and reflected power $V_r$ are input to a phase detector 46. Phase detector 46 determines the phase between the forward power signal $V_f$ and the reflected power signal $V_r$. Phase detector 46 outputs a signal which is proportional to the phase between the forward power $V_f$ and reflected power $V_r$. The phase, referred to as the gamma phase, is input to processor 48 along with the forward power $V_f$ and the reflected power $V_r$. Processor 48 receives the signals and optionally scales the magnitude and phase values to obtain values which may then be used to derive other desired quantities.

Figure 2:
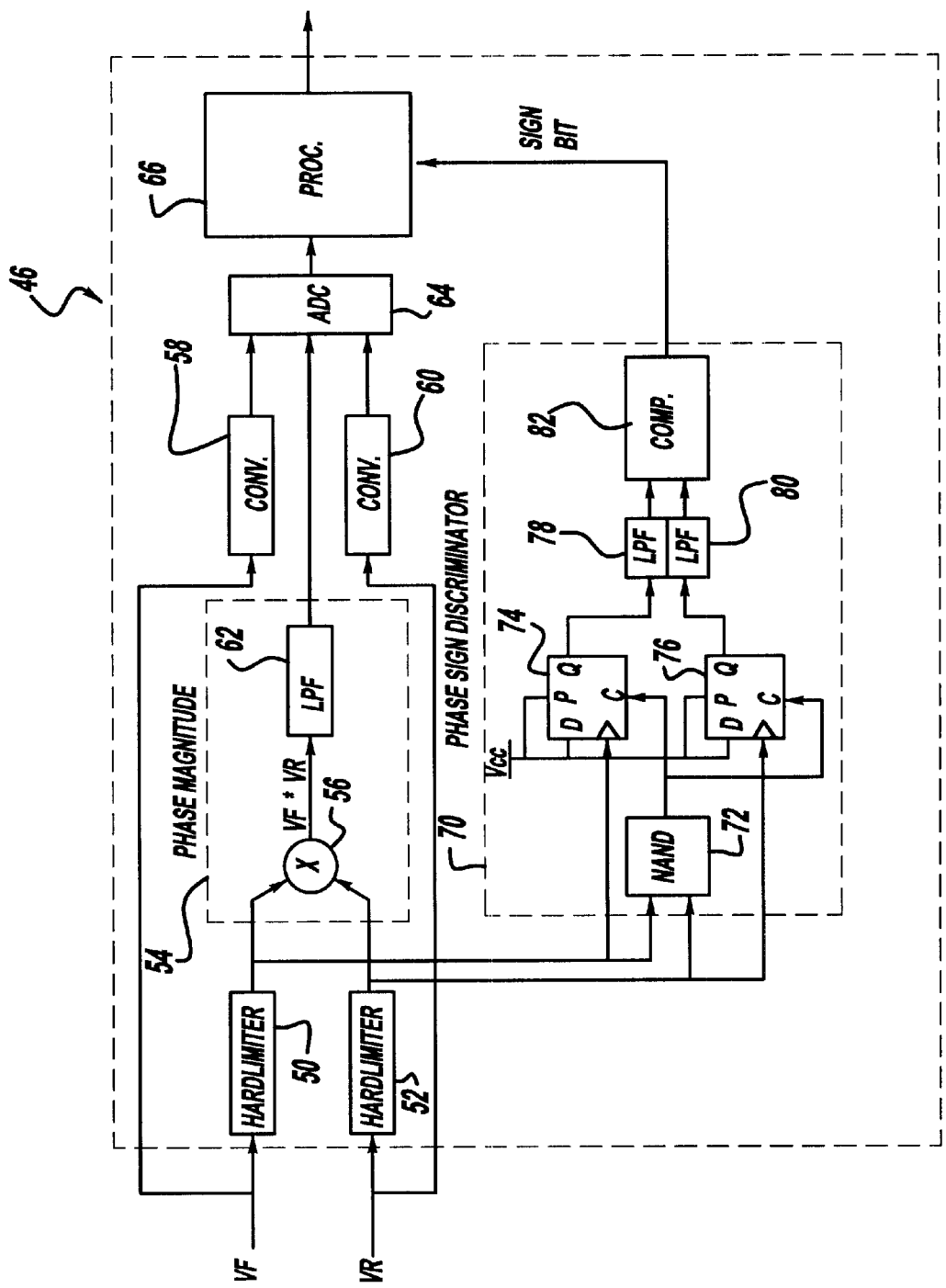
FIG. 2 is a block diagram of the phase detector of FIG. 1.

FIG. 2 depicts an expanded block diagram of phase detector 46. In operation, the forward power $V_f$ and reflected power $V_r$ are received from power coupler 44 and are applied to respective hardlimiters 50, 52, which define upper and lower limits for signals $V_f$ and $V_r$. Hardlimiters 50, 52 normalize the respective forward power $V_f$ and reflected power $V_r$ to take out any amplitude variation between the signals. The output of hardlimiters 50, 52 is applied to phase magnitude detector 54. Phase magnitude detector 54 includes a mixer 56, which outputs the product of the forward power $V_f$ and the reverse power $V_r$ to define a mixed signal. The mixed signal is applied to a low pass filter (LPF) 62. Low pass filter 62 attenuates the time dependent information contained in the mixed signal. Attenuating the time dependent information leaves only a direct current (DC) signal which is proportional to the phase between the forward power $V_f$ and the reflected power $V_r$.

Phase detector 46 also includes a pair of conversion circuits 58, 60. Conversion circuits 58, 60 convert the forward power $V_f$ and reflected power $V_r$ to respective DC signals. Such a conversion may occur using a peak and hold circuit or a more complex sum of squares detector. The output from conversion circuits 58, 60 is input to analog-to-digital converter (ADC) 64.

The forward power $V_f$, the reverse power $V_r$, and the filtered signal are each input to an ADC 64. Analog-to-digital converter 64 selectively samples the input signals and outputs a digital signal corresponding to the analog value of the respective sampled signal. The digitized signals are input to processor 66.

In addition to phase magnitude detector 54, phase detector 46 includes a phase sign discriminator 70. Sign discriminator 70 receives as input the output from hardlimiters 50, 52 which represent the hardlimited signals of forward power $V_f$ and reflected power $V_r$. The hardlimited signals are input to a NAND gate 72 and are also input to the clock input of a pair of respective delay elements 74, 76. A voltage $V_{cc}$ is applied to the D inputs of delay elements 74, 76. The output from NAND gate 72 is applied to the clear C inputs of delay elements 74, 76. The output from delay elements 74, 76 is applied to respective low pass filters (LPF) 78, 80. The output from low pass filters 78, 80 is applied to comparator 82. Comparator 82 outputs a sign bit which is input to processor 66.

The sign bit determines the sign of the relative phase between forward power $V_f$ and reflected power $V_r$. Phase sign discriminator 70 thus determines whether the forward power $V_f$ leads the reflected power $V_r$ or vice versa. In operation, the voltage which causes the respective delay element 74, 76 to pass through the signal applied at the D input also resets the other delay element so that one delay element outputs a high signal and the other delay signal outputs a low signal. Comparator 82 detects which delay element outputs a high signal and which delay element outputs a low signal and sets the sign bit accordingly.

Processor 66 may be embodied as any processor, many of which are known in the art. In a preferred embodiment processor 66 is embodied as a field programmable gate array (FPGA). Processor 66 determines which of the inputs to ADC 64 is analog to digital converted and applied to processor 66. Optionally, processor 66 bundles the input from ADC 64 with the sign bit received from comparator 82 and prepares a packet of information for transmission to processor 48 or other system elements. Processor 66 thus acts as a controller within phase detector 46 and as an optional interface unit for communications with processor 48 or other devices.

The output from processor 66 is applied to processor 48 which may perform any of a variety of processing functions. These functions include calibration, filtering, calculation of additional values, or other desirable functions. By way of example, processor 48 may determine the complex load impedance experienced by the coupler, the standing wave ratio of the sum of the forward and reflected power, the reactive power, the magnitude of the voltage at the coupler, and the magnitude at the current at the coupler.

In operation, a single time varying signal is complex by nature, containing both magnitude and phase relative to some point of reference. When confronted with two such signals, the phase of each signal can be represented as a relative quantity expressed as a mathematical difference. With the magnitudes of both signals and the relative phase between both signals known, most other useful quantities related to the original signals as described above may be derived and analyzed.

Phase detector 46 enables detection of the complex reflection coefficient, also knows as a gamma phase, utilizing two time varying signals having a fundamental frequency which is known to be proportional to the forward and reflected power being output from power coupler 44. With the phase of the complex reflection coefficient, the gamma phase, and the magnitudes of both the forward and reflected power, other parameters interest can be derived such as the complex load impedance input to the coupler, the standing wave ratio (SWR) of the forward and reflected power sum, the reactive power, and the magnitudes of the voltage and current at the coupler.

Operation of phase detector 46 may be modeled as discussed below. If the function $A \cos(x)$ represents a first sinusoidal wave, such as the forward $V_f$ or the reflected power $V_r$, where A is the magnitude of the selected signal. Similarly, let $B \cos(y)$ represent the other of the forward power of $V_f$ and the reflected power $V_r$, where B is the magnitude of the signal. The mixed signals can be represented as shown below in equation (1).

$$s = A\cos(x) * B\cos(y) \tag{1}$$

Using well known identities, the mixed signals may be further represented as shown below in equation (2).

$$s = (A*B)/2 * [\cos(x+y) + \cos(x-y)] \tag{2}$$

Now, letting $x = \omega t$ and $y = \omega t + P$, where $\omega$ is the frequency, t is time, and P is the phase between the forward power $V_f$ and the reflected power $V_r$, by making the substitution for x and y, equation (1) can be rewritten as shown below in equation (3).

$$s = A\cos(\omega t) * B\cos(\omega t + P) \tag{3}$$

Similarly, equation (2) can be rewritten as equation (4).

$$s = (A*B)/2 * [\cos(2\omega t + P) + \cos(P)] \tag{4}$$

From equation (4), we note that if the original forward power $V_f$ and reflected power $V_r$ signals have a fundamental frequency $\omega = f_s$, then the two signals multiplied together form a signal with two components. One component has a frequency of $2 \times f_s$ and the other component is a DC signal. Accordingly, selecting low pass filter 52 of FIG. 2 as a third order low pass filter with a cut-off frequency $f_c = (2 \times f_s)/10$ provides an approximate 60 decibel (dB) attenuation for the time varying portion of the signal. This leaves only the DC component remaining, which is substantially unaltered.

After filtering the mixed signal s, the filtered s may be represented as shown in equation (5).

$$s = (A*B)/2 * \cos(P) \qquad (5)$$

Therefore, the phase P can be determined in accordance with the following relation:

$$P = \arccos\left(\frac{2 \times s}{A \times B}\right) \qquad (6)$$

Thus, with this information, processor 48 may determine the phase P in accordance with equation (5).

One skilled in the art will recognize that there are other approaches for effecting the phase detection discussed herein. In particular, mixer 56 of FIG. 2 may be replaced with a high speed exclusive-or (XOR) gate and a filter to determine the magnitude of the phase difference. Alternatively, the forward power $V_f$ and reflected power $V_r$ may be digitally sampled and converted to the frequency domain so that phase may be extracted. In yet another approach, a phase lock loop (PLL) may lock onto each of the forward power $V_f$ and the reflected power $V_r$ signals and determine the phase difference between these two signals. In yet another configuration, a zero crossing detector may determine which signal is leading or lagging and count the time between the signal edges.

Further, one skilled in the art will recognize that the concepts described herein need not be limited to detecting phase between a forward power and a reflected power. The teachings of the present invention extended to any pair of operating parameters for a power delivery system in which it is desirable to determine a phase between the parameters.

While the invention has been described in its presently preferred form, it is to be understood that there are numerous applications and implementations for the present invention. Accordingly, the invention is capable of modification and changes without departing from the spirit of the invention as set forth in the appended claims

What is claimed is:

1. A power delivery system receiving an input power and generating an output power to a load comprising:
    a power generator, the power generator receiving the input power and generating the output power, the power generator output being applied to the load;
    a directional coupler interposed between the load and the power generator for sensing a forward power and a reflected power; and
    a phase detector for determining a relative phase between the forward power and the reflected power.

2. The power delivery system of claim 1 wherein the phase detector further comprises a magnitude generator, the magnitude generator receiving the forward power and the reflected power and generating a signal that varies in accordance with a magnitude of the phase between the forward and the reflected power.

3. The power delivery system of claim 2 wherein the magnitude generator further comprises:
    a mixer for mixing the forward power and the reflected power to define a mixed signal; and
    a low pass filter for passing a direct current (DC) component of the mixed signal, the low pass filter removing a time dependent component of the mixed signal, wherein the DC component is proportional to the phase between the forward power and the reflected power.

4. The power delivery system of claim 1 wherein the phase detector further comprises a polarity generator, the polarity generator receiving the forward power and the reflected power and generating a signal that varies in accordance with a polarity of the phase between the forward and the reflected power.

5. The power delivery system of claim 1 further comprising a processor, the processor scaling at least one of the forward power, the reflected power, and the magnitude of the phase between the forward power and the reflected power.

6. The power delivery system of claim 5 wherein the processor determines at least one of a complex load impedance, a standing wave ratio of a sum of the forward power and the reflected power, a reactive power, a magnitude of a voltage at the coupler, and a magnitude of a current at the coupler.

7. The power delivery system of claim 1 further comprising an impedance matching network interposed between the power generator module and the load.

8. The power delivery system of claim 1 wherein the phase detector further comprises:
    a magnitude generator, the magnitude generator receiving the forward power and the reflected power and generating a signal that varies in accordance with a magnitude of the phase between the forward and the reflected power; and
    a polarity generator, the polarity generator receiving the forward power and the reflected power and generating a signal that varies in accordance with a polarity of the phase between the forward and the reflected power.

9. The power delivery system of claim 8 wherein the magnitude generator further comprises:
    a mixer for mixing the forward power and the reflected power to define a mixed signal; and
    a low pass filter for passing a direct current (DC) component of the mixed signal, the low pass filter removing a time dependent component of the mixed signal, wherein the DC component is proportional to the phase between the forward power and the reflected power.

10. The power delivery system of claim 8 further comprising a processor, the processor scaling at least one of the forward power, the reflected power, and the magnitude.

11. The power delivery system of claim 10 wherein the processor determines at least one of a complex load impedance, a standing wave ratio of a sum of the forward power and the reflected power, a reactive power, a magnitude of a voltage at the coupler, and a magnitude of a current at the coupler.

12. The power delivery system of claim 8 further comprising an impedance matching network interposed between the power generator module and the load.

13. An apparatus comprising;
    a power delivery system coupler receiving an output from a power generator for detecting a first parameter and a second parameter, the coupler generating a respective first signal and a second signal, each signal varying in accordance with the respective first and second parameters; and
    a phase detector, the phase detector receiving the first signal and the second signal form the coupler, the phase detector determining a relative phase between the first signal and the second signal in accordance with the first parameter and the second parameter, the phase detector further including a magnitude generator, the magnitude generator receiving the first signal and the second signal and generating a magnitude signal that varies in accordance with a magnitude of the phase between the first parameter and the second parameter.

14. The apparatus of claim 13 wherein the magnitude generator further comprises;
   a mixer for mixing the first signal and the second signal to define a mixed signal; and
   a low pass filter for passing a direct current (DC) component of the mixed signal, the low pass filter removing a time dependent component of the mixed signal, wherein the DC component is proportional to the phase between the first parameter and the second parameter.

15. The apparatus of claim 13 wherein the phase detector further comprises a polarity generator, the polarity generator receiving the first signal and the second signal and generating a signal that varies in accordance with a polarity of the phase between the first parameter and the second parameter.

16. The apparatus of claim 13 further comprising a processor, the processor scaling at least one of the first signal, the second signal, and the magnitude.

17. The apparatus of claim 16 wherein the processor determines at least one of a complex load impedance, a standing wave ratio of a sum of the forward power and the reflected power, a reactive power, a magnitude of a voltage at the coupler, and a magnitude of a current at the coupler.

18. The apparatus of claim 13 wherein the phase detector further comprises:
   a magnitude generator, the magnitude generator receiving the first signal and the second signal and generating a signal that varies in accordance with a magnitude of the phase between the first parameter and the second parameter; and
   a polarity generator, the polarity generator receiving the first signal and the second signal and generating a signal that varies in accordance with a polarity of the phase between the first parameter and the second parameter.

19. The apparatus of claim 18 wherein the magnitude generator further comprises:
   a mixer for mixing the first signal and the second signal to define a mixed signal; and
   a low pass filter for passing a direct current (DC) component of the mixed signal, the low pass filter removing a time dependent component of the mixed signal, wherein the DC component is proportional to the phase between the first parameter and the second parameter.

20. The apparatus of claim 18 further comprising a processor, the processor scaling at least one of the first signal, the second signal, and the magnitude.

21. The apparatus of claim 20 wherein the processor determines at least one of a complex impedance, a standing wave ratio of a sum of the forward power and the reflected power, a reactive power, a magnitude of a voltage at the coupler, and a magnitude of a current at the coupler.

22. The phase detector of claim 13 wherein the first signal is sinusoidal, and the second signal is sinusoidal.

23. The phase detector of claim 13 wherein the one of the first and second signals is represented by $A\cos(\omega t)$ and the other of the first and second signals is represented by $B\cos(\omega t+P)$, where $\omega$ represents frequency of the first and second parameter signals, $t$ represents time, and $P$ represents the relative phase, and A and B are constants, wherein the mixed signal s is represented as:

$$s = \frac{(A \times B)}{2} \times [\cos(2\omega t + P) + \cos(P)],$$

and wherein the DC component proportional to the phase is represented as $$\frac{(A \times B)}{2} \times \cos(P).$$

24. The phase detector of claim 23 wherein the phase P is represented as $$P = \arccos\left(\frac{2 \times s}{A \times B}\right).$$

25. A method for phase detection comprising the steps of:
   providing a power delivery system having a coupler receiving an output from a power generator;
   detecting a first parameter and a second parameter using the power coupler;
   generating a first signal and a second signal based upon respective first parameter and second parameter, each signal varying in accordance with the respective first and second parameters;
   determining a relative phase between the first signal and the second signal in accordance with the first parameter and the second parameter; and
   generating a magnitude signal that varies in accordance with a magnitude of the phase between the first parameter and the second parameter.

26. The method of claim 25 further comprising the step of generating a signal that varies in accordance with a polarity of the phase between the first parameter and the second parameter.

27. The method of claim 25 further comprising the step of scaling at least one of the first signal, the second signal, and the magnitude.

28. The method of claim 25 further comprising the step of determining at least one of a complex load impedance, a standing wave ratio of a sum of the forward power and the reflected power, a reactive power, a magnitude of a voltage at the coupler, and a magnitude of a current at the coupler.

* * * * *

UNITED STATES PATENT AND TRADEMARK OFFICE
CERTIFICATE OF CORRECTION

PATENT NO. : 6,657,394 B2
DATED : December 2, 2003
INVENTOR(S) : Kevin P. Nasman It is certified that error appears in the above-identified patent and that said Letters Patent is hereby corrected as shown below:

<u>Column 6,</u>
Line 51, ";" should be -- : --.
Line 59, "form" should be -- from --.

<u>Column 7,</u>
Line 2, ";" should be -- : --.

Signed and Sealed this

Fifteenth Day of June, 2004

JON W. DUDAS
*Acting Director of the United States Patent and Trademark Office*